(12) United States Patent
Yang et al.

(10) Patent No.: US 6,599,759 B2
(45) Date of Patent: Jul. 29, 2003

(54) METHOD FOR DETECTING END POINT IN PLASMA ETCHING BY IMPEDANCE CHANGE

(75) Inventors: Jen-Yuan Yang, Taipei (TW); Tsai-Yi Chen, Chu-pei (TW); Wen-Bin Lin, Chu-pei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 73 days.

(21) Appl. No.: 09/847,459

(22) Filed: May 2, 2001

(65) Prior Publication Data

US 2002/0162822 A1 Nov. 7, 2002

(51) Int. Cl.⁷ ............................................. H01L 21/302
(52) U.S. Cl. ................ 438/5; 438/10; 438/11; 438/14; 438/714; 438/720; 438/17; 438/18; 216/84; 216/86
(58) Field of Search .................... 216/84, 86; 438/714, 438/10, 11, 17, 18, 5, 14, 720

(56) References Cited

U.S. PATENT DOCUMENTS 4,207,137 A  *  6/1980  Tretola ....................... 156/627
5,971,591 A  *  10/1999  Vona et al.
6,326,794 B1  *  12/2001  Lundquist et al. .......... 324/678

FOREIGN PATENT DOCUMENTS

JP       06-120173       *   4/1994

OTHER PUBLICATIONS

"Endpoint Determination of Aluminum Reactive Ion Etching by Discharge Impedance Monitoring"; Ukai et al.; (1979); J. Vac. Sci. Tech. 16(2); pp. 385–387.*

"Plasma Etching Endpointing by Monitoring Radio–Frequency Power Systems with an Artificial Neural Network"; Journal of the Electrochemical Society; 143(6); pp. 2029–2035; (1996).*

* cited by examiner

Primary Examiner—George Goudreau
(74) Attorney, Agent, or Firm—Tung & Associates

(57) ABSTRACT

A method for detecting end-point in a plasma etching process by monitoring plasma impedance changes on a time scale is disclosed. In the method, a plasma etching process is first conducted in a process chamber, while changes in a parameter of plasma impedance in the chamber occurring during the etching process is recorded in a curve on a time scale. An end-point of the plasma etching process is then defined for the etching of a specific material layer at a point where the direction of a slope of the curve changes.

16 Claims, 2 Drawing Sheets

METHOD FOR DETECTING END POINT IN PLASMA ETCHING BY IMPEDANCE CHANGE

FIELD OF THE INVENTION

The present invention generally relates to a method for detecting end-point in a plasma etching process and more particularly, relates to a method for detecting end-point in a plasma etching process by monitoring an impedance change in the RF power of the plasma as an indication that an interface between two different material layers has been reached.

BACKGROUND OF THE INVENTION

In the fabrication and processing of semiconductor devices, such as silicon wafers, a variety of different semiconductor equipment and/or tools are utilized. These tools and equipment are well-known in the art, and include for example, photolithographic machines, etchers, deposition equipment, furnaces, as well as a variety of sensors and control equipment. Although the capabilities of these types of semiconductor processing equipment have improved over the years, the technique of monitoring the ongoing process has not necessarily kept pace with the improvements. In the area of monitoring the ongoing semiconductor manufacturing process, current practices generally utilize ex-situ process monitoring. A problem with ex-situ monitoring is that the results are not available until the end of the process, or if in-situ readings are required, the ongoing process must necessarily be interrupted in order to obtain the required reading. Moreover, where a number of parameters are monitored for a given process, it is difficult to determine the dependency of one parameter to the others. Such processing parameter correlations are difficult to obtain, and are made even more difficult when measurements are being taken for the purpose of providing in-situ control of the ongoing process.

As mentioned above, one of the processes involved in manufacturing semiconductor devices is etching. A number of etching technologies may be employed, such as reactive ion etching (RIE) for etching fine line or small via patterns in a silicon wafer. RIE involves positioning a masked wafer in a chamber containing plasma. The plasma contains etchant gases which are vertically disassociated in an RF so that the reactive ions contained in the etchant gases are accelerated to the wafer surface. The accelerated reactive ions combine chemically with unmasked material on wafer's surface.

In connection with the plasma etching process, it is known to monitor the progress of the etching process by measuring the intensity of the plasma emissions at a specific wavelength. Changes in the level of intensity of the plasma at the wavelength of interest can be correlated to the progress of the etching process, consequently this technique may be employed to determine the time at which the etching process should be ended, such time point being commonly referred to in the art as the "end-point" time. It is further known that during normal, stable operating conditions, the end-point, as determined by a change in the monitored wavelength, should be within a certain range. However, certain processing conditions, indicative of an unstable processing condition or other problems affect the end-point time. For example, incorrect process parameters, wrong recipes, improper part installation during maintenance, chamber or line leakage and other similar problems result in an unstable process which is normally not detected until a batch, or even a complete lot of wafers has been processed. This after-the-fact detection of unstable processing conditions results in substantial scrap and decreased yield.

Although it is known that a change in the monitored wavelength of the plasma is correlatable to the end-point time, such information has not been effectively employed for early detection of unstable processing conditions, and particularly with respect to batch-to-batch and lot-to-lot processing variations that reduce yield.

In U.S. Pat. No. 6,117,348 issued Sep. 12, 2000 and assigned to the common assignee of the present invention, a method for real time monitoring of a plasma etching process as well as an apparatus for performing the same are disclosed. The method monitors a plasma etching process employed to produce multiple batches or lots of semiconductor devices, such as silicon wafers. The method broadly comprises the steps of detecting a change in a characteristic of the plasma during etching of a wafer or a wafer batch; recording the time when the change in the characteristic is detected, such recorded time representing the duration of the etching and defining an end-point value; comparing the end-point value with one or more reference values corresponding to stable process conditions; and issuing a notice of unstable process conditions based on the results of the comparison. The characteristic to be detected preferably comprises a change in the intensity of a specific wavelength generated by the plasma employed to perform the etching. The method also includes the step of storing a plurality of end-point values respectively recorded during the etching of a plurality of corresponding wafers, and employing these stored values as a reference with which a monitored end-point value is compared.

The patent also discloses an apparatus for carrying out the method, including means for sensing a particular wavelength of interest emitted by the plasma, means for analyzing the monitored wavelength, and for detecting a change in the intensity of such wavelength, and a program controller for calculating an end-point valve using the measured changes in wavelength intensity and for comparing the measured end-point with one or more reference values corresponding to stable processing conditions.

FIG. 1 depicts the primary components of a typical reaction ion etching system, as well the components forming the real time monitoring system. A wafer 14 to be etched, typically a masked wafer, is placed on a cathode 16 inside a plasma chamber 12 filled with plasma, all of which components form a part of a plasma etching apparatus 10. Although the reactive ion etching system shown in FIG. 1 employs a cathode 16 as the heating source, a system in which both the anode and cathode are powered can also be utilized. A gas supply 20 provides the necessary etchant gas to the plasma in the chamber 12, and a pump 22 is employed for evacuating plasma discharge during etching. A RF generator 18 supplies RF power to the cathode 16 so as to form an RF field in the plasma. The RF field causes reactive ions contained in the etchant gas to accelerate to the surface of the wafer 14. The thus accelerated reactive ions combine chemically with unmasked material on the surface of the wafer so as to form volatile etch product. The volatile etch product is released into the plasma and a plasma chamber 12 and a plasma discharges is formed. This discharge includes the emissions of light at specific wavelengths which are determined by the particular gases and materials employed in the process. For example, a CO plasma employed to etch an oxide surface emits light at a wavelength of 480–485 nm, an Al plasma used to etch metal substrates emits light at a wavelength of 396 nm, and a SF plasma used to etch a polysilicon substrate emits light at a wavelength of approximately 400 nm.

As shown in FIG. 1, changes in the level of intensity of the wavelength emitted by the plasma in the chamber 12 are continuously monitored by a suitable sensor 24 which transmits the monitored wavelength via a line, which may comprise an optical fiber 26, to a device such as a spectrometer 28, which in turn outputs a signal to the device such as a multi-channel analyzer 30 which isolates the wavelength of interest and measures its intensity. The measured intensity, as well as changes therein, is transmitted by the analyzer 30 to a programmed controller 32 which includes a microprocessor controller 34 provided with suitable memory 36 for storing end-point time reference values. The microprocessor 34 operates in accordance with a set of programmed instructions which receives data from the analyzer 30 relating to changes in the monitored wavelength, determines the end-point time for a wafer or batch of wafers being processed, and compares the end-point time with one of the reference values. Based on the results of the comparison thus performed, the controller 32 may issue a notice announcing that the etching process has become unstable and/or issue instructions which result in either alteration or termination of the etching process within the etching apparatus 10.

In the conventional system for monitoring spectrographically a plasma intensity inside a chamber, as shown in FIG. 1, the plasma wavelengths in the chamber is monitored by a sensor 24 through a window that is transparent to the sensor. After the plasma etch chamber is operated continuously for a large number of etching processes, etch by-products of a polymeric nature will deposit on the sensor window. The window is therefore no longer transparent to the sensor for the accurate monitoring of the plasma wavelength. The accuracy of measurement continuously deteriorates as the plasma etching chamber is further used leading to various problems in end-point detection.

Accordingly, there is a clear need in the art for a method for monitoring the plasma etching process and for determining the end-point of the process that is not dependent on the optical monitoring of a plasma wavelength through a sensor window, and therefore eliminating the deficiencies discussed above.

It is therefore an object of the present invention to provide a method for detecting end-point in plasma etching that does not have the drawbacks or shortcomings of the conventional methods.

It is another object of the present invention to provide a method for detecting end-point in plasma etching that does not require the monitoring of the optical properties of the plasma.

It is a further object of the present invention to provide a method for detecting end-point in plasma etching that does not require the monitoring of plasma wavelength through a sensor window.

It is another further object of the present invention to provide a method for detecting end-point in plasma etching by monitoring the RF impedance change in the plasma.

It is still another object of the present invention to provide a method for detecting end-point in plasma etching by monitoring an RF match capacitance change in the plasma.

It is yet another object of the present invention to provide a method for detecting end-point in plasma etching by monitoring changes in RF coil tuning counts in the plasma.

SUMMARY OF INVENTION

In accordance with the present invention, a method for detecting end-point in a plasma etching process by monitoring the plasma impedance change, the RF match capacitance change or the RF coil tuning count change is provided.

In a preferred embodiment, a method for detecting end-point in a plasma etching process by monitoring an impedance change can be carried out by the steps of conducting a plasma etching process in a process chamber; recording in a curve changes in a parameter of plasma impedance in the chamber occurring during the etching process on a time scale; and finding an end-point of the plasma etching process for a specific material layer as a point where the direction of the slope of the recorded curve changes.

The method for detecting end-point in plasma etching by impedance change may further include the step of recording in a curve changes in a parameter of plasma impedance versus time curve, or the step of defining the end point of the plasma etching process as the point where a TiN stop layer is reached, or the step of defining the end-point of the plasma etching process as the point where an interface between an Al—Cu layer and a TiN layer is reached. The method may further include the step of defining the end point of the plasma etching process as the point where a sudden increase in the plasma impedance is intersected by a sudden decrease in the plasma impedance. The method may further include the step of conducting the plasma etching process while continuously tuning in real time a zero differential in phases between an RF voltage and an RF current.

The present invention is further directed to a method for detecting end-point in a plasma etching process by monitoring RF match capacitance change which can be carried out by the steps of conducting a plasma etching process in a process chamber; recording in a curve changes in a parameter of RF match capacitance in the chamber during the etching process on a time scale; and defining end-point of the plasma etching process for a specific material layer as a point where a direction of the slope of the curve changes.

The method for detecting end-point in plasma etching by RF match capacitance change may further include the step of recording in a curve changes in the parameter of RF match capacitance by plotting an RF match capacitance versus time curve. The method may further include the step of defining the end-point of the plasma etching process as the point where a TiN etch stop layer is reached, or the step of defining the end-point of the plasma etching process as the point where an interface between an Al—Cu layer and a TiN layer is reached. The method may further include the step of defining the end-point of the plasma etch process as the point where a sudden increase in the RF match capacitance is intersected by a sudden decrease in the RF match capacitance.

The present invention further discloses a method for detecting end-point in plasma etching by changes in RF coil tuning counts which can be carried out by the steps of conducting a plasma etching process in a process chamber; recording in a curve changes in a parameter of RF coil tuning counts in the chamber during the etching process on a time scale; and defining an end-point of the plasma etching process for a specific material layer as a point where the direction of the slope of the curve changes.

The method for detecting end-point in plasma etching by changes in RF coil tuning counts may further include the step of recording in a curve changes in a parameter of RF coil tuning counts by plotting an RF coil tuning count versus time curve. The method may further include the step of defining the end point of the plasma etching process at the point where a TiN etch stop layer is reached, or the point wherein an interface between an Al—Cu layer and a TiN layer is reached. The method may further include a step of defining the end-point of the plasma etching process as the point where a sudden increase in the RF coil tuning count is intersected by a sudden decrease in the RF coil tuning count.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discusses a method for detecting end-point in a plasma etching process by monitoring the plasma impedance change during the process in a process chamber.

The process can be carried out by first conducting a plasma etching process in the process chamber and simultaneously recording in a curve changes in a parameter of the plasma impedance in the chamber during the etching process on a time scale, and then defining an end-point of the plasma etching process for a specific material layer as a point where the direction of a slope of the curve changes. For instance, the end-point may be defined as the point where a TiN etch stop layer is reached, or an interface between an Al—Cu layer and a TiN layer is reached. After a plasma impedance versus time curve is obtained from the etching process, the point where a sudden increase in the plasma impedance intersected by a sudden decrease in the plasma impedance is taken as the end-point of the etching process. The matchbox utilized in the present invention novel method continuously tuning in real time a zero deferential in phases between an RF voltage and an RF current.

The present invention novel method therefore eliminates the use of an optical sensor for sensing the plasma intensity and for detecting changes in a specific wavelength of the plasma intensity as the end-point signal. The present invention novel method therefore eliminates the drawback of a loss in sensing accuracy due to the deposition of a reaction by-product on a sensor window which impedes the optical sensing of the plasma intensity. Instead of the optical property sensed, the invention senses a plasma impedance change, or an RF match capacitance, or an RF coil tuning counts and follows a sudden change in the direction of a slope of a curve as the end-point signal to detect an end of the etching process.

Figure 1:
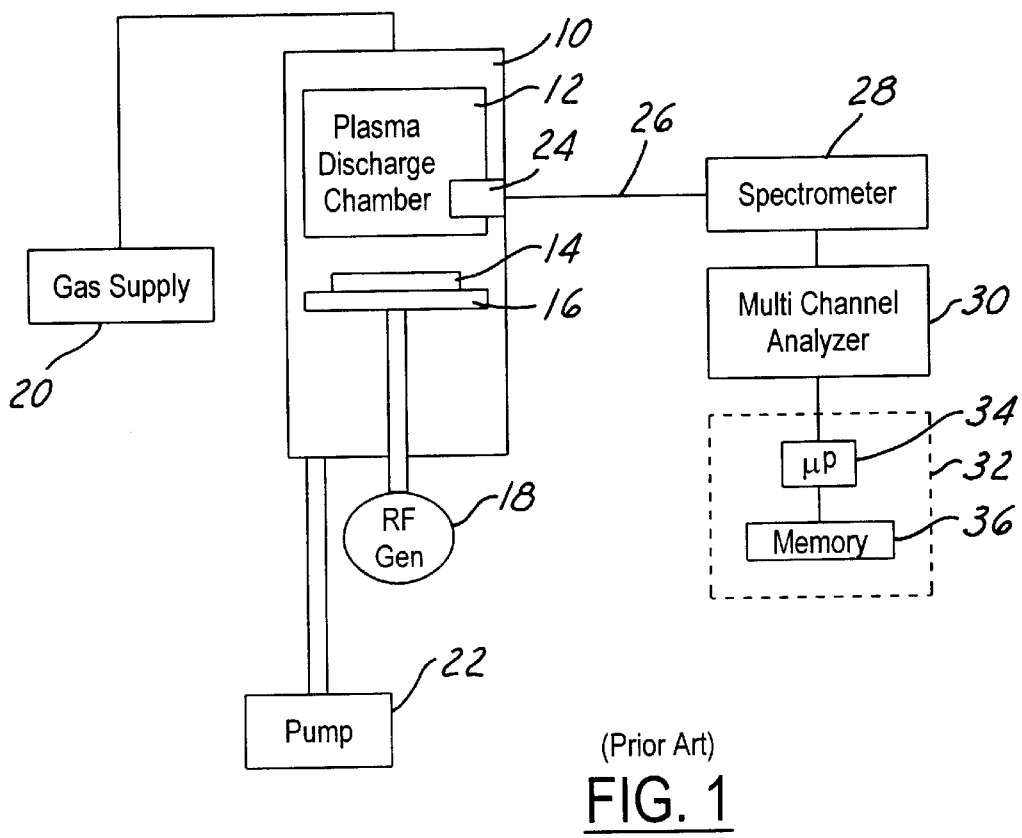
FIG. 1 is a graph illustrating a conventional method of using spectrometric technique for determining the end-point of a plasma etching process conducted in a plasma discharge chamber.
Figure 2:
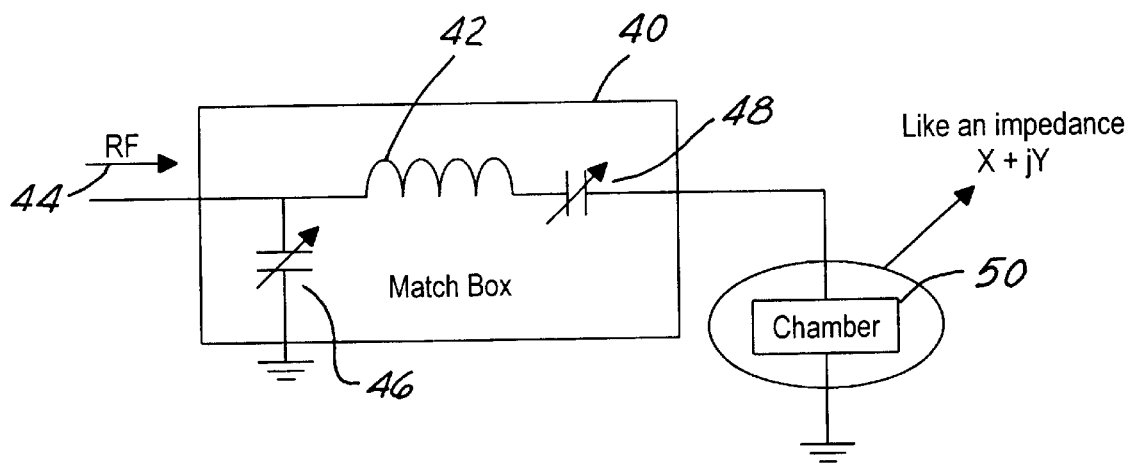
FIG. 2 is a graph illustrating the present invention concept of monitoring the impedance change in a plasma chamber by using a matchbox technique.

Referring initially to FIG. 2 wherein a matchbox device 40 utilized in the present invention novel method is shown. The matchbox device 40 includes an RF matching transformer 42 for receiving an RF signal 44 and for adjusting capacitor assemblies 46 and 48 before the RF signal is sent into an etch chamber 50. A more detailed illustration of the present invention matchbox device 40 is further shown in FIG. 3. It should be noted that two DC motors 52, 54 are also shown in FIG. 3 for adjusting the capacitance for RF matching in the capacitor assemblies 46 and 48.

Figure 4:
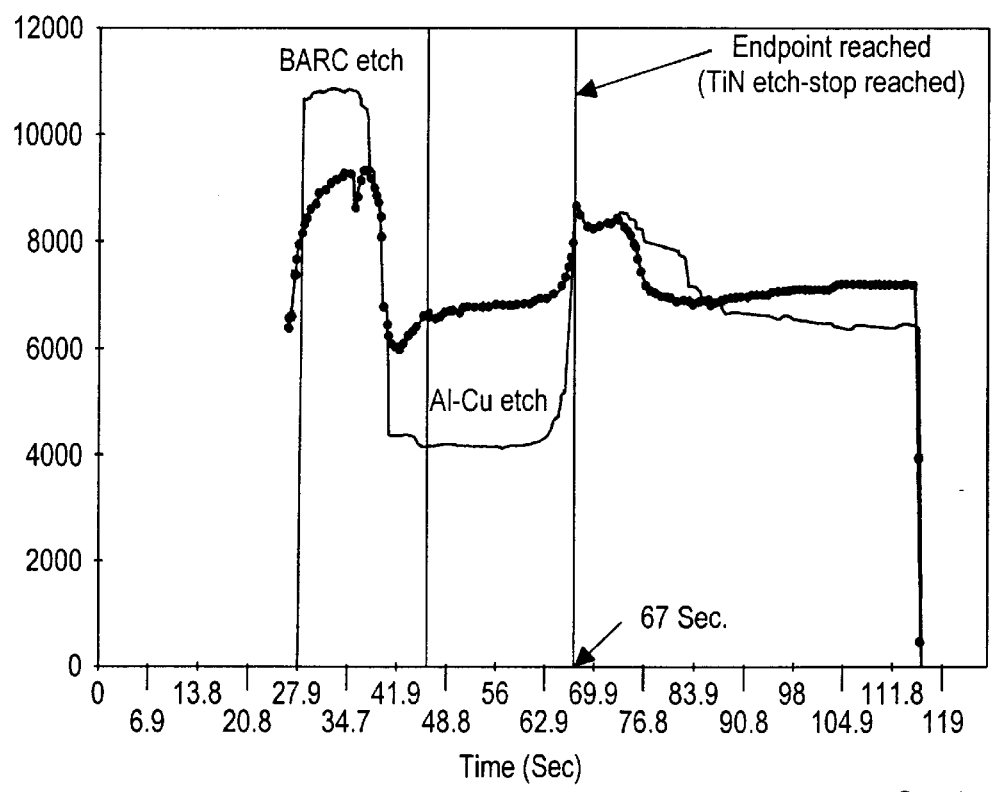
FIG. 4 is a graph illustrating changes in plasma impedance versus time compared to the optical wavelength change versus time by the conventional method.

The effectiveness of the present invention novel method is shown in FIG. 4 in a graph plotted of both a plasma impedance change and an optical spectrometer change on a time scale, for comparison. The optical spectrometer change is obtained by a conventional optical monitoring method. The heavy line shown in FIG. 4 represents the plasma impedance change based on time, while the thin line in FIG. 4 represents the optical spectrometer change based on time. It is seen that after an RF power is turned on at 27.9 sec., both the plasma impedance and the optical spectrum increases representing a bottom ARC (anti-reflectance coating) etching process. When the bottom ARC layer of TiN is completely etched away, the impedance and the spectrum (or plasma intensity) changes simultaneously until an aluminum-copper layer etch is started, represented by the plateau region in both curves. At the end of the etching process for the aluminum-copper layer, as represented by the end-point occurring at about 67 SEC the increasing slope of both curves suffers a change in the direction of the slope downwardly which is a clear indication that a TiN etch stop layer is reached. At this stage of the etching process, the RF power should be switched off since all the aluminum-copper layer has been etched away.

Figure 3:
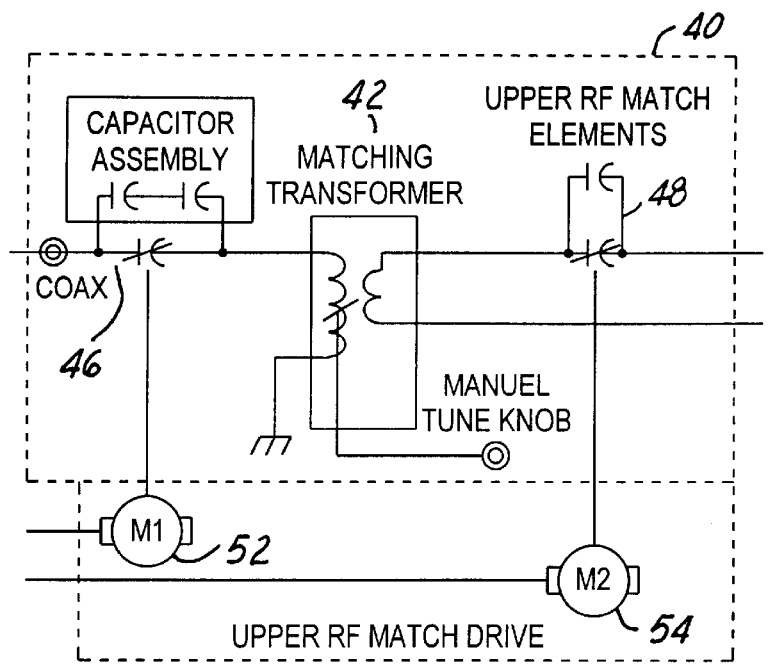
FIG. 3 is a detailed illustration of the matchbox technique shown in FIG. 2.

The present invention novel method for detecting end-point in a plasma etching process by monitoring plasma impedance changes on a time scale has therefore been amply described in the above-description and in the appended drawings of FIGS. 2, 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for detecting end-point in plasma etching by impedance change comprising the steps of:

conducting a plasma etching process in a process chamber, while continuously tuning in real-time a zero differential in phased between an RF voltage and an RF current;

recording in a curve changes in a parameter of plasma impedance in said chamber occurring during said etching process on a time scale; and defining an end-point of the plasma etching process for a specific material layer as a point where the direction of a slope of the curve changes.

2. A method for detecting end-point in plasma etching by impedance change according to claim 1 further comprising the step of recording in a curve changes in a parameter of plasma impedance by plotting a plasma impedance vs time curve.

3. A method for detecting end-point in plasma etching by impedance change according to claim 1 further comprising the step of defining said end-point of the plasma etching process as the point where a TiN etch stop layer is reached.

4. A method for detecting end-point in plasma etching by impedance change according to claim 1 further comprising the step of defining said end-point of the plasma etching process as the point where an interface between an Al—Cu layer and a TiN layer is reached.

5. A method for detecting end-point in plasma etching by impedance change according to claim 1 further comprising the step of defining said end-point of the plasma etching process as the point where a sudden increase in the plasma impedance is intersected by a sudden decrease in said plasma impedance.

6. A method for detecting end-point in plasma etching by RF match capacitance change comprising the steps of:

conducting a plasma etching process in a process chamber;

recording in a curve changes in a parameter of RF match capacitance in said chamber during said etching process on a time scale; and defining an end-point of the plasma etching process for a specific material layer as a point where a sudden increase in the RF match capacitance is intersected by a sudden decrease in said RF match capacitance.

7. A method for detecting end-point in plasma etching by RF match capacitance change according to claim 6 further comprising the step of recording in a curve changes in the parameter of RF match capacitance by plotting an RF match capacitance vs time curve.

8. A method for detecting end-point in plasma etching by RF match capacitance change according to claim 6 further comprising the step of defining said end-point of the plasma etching process as the point where a TIN etch stop layer is reached.

9. A method for detecting end-point in plasma etching by RF match capacitance change according to claim 6 further comprising the step of defining said end-point of the plasma etching process as the point where an interface between an Al—Cu layer and a TiN layer is reached.

10. A method for detecting end-point in plasma etching by RF match capacitance change according to claim 6 further comprising the step of conducting said plasma etching process while continuously turning in real-time a zero differential in phases between a RF voltage and a RF current.

11. A method for detecting end-point in plasma etching by changes in RF coil tuning counts comprising the steps of:

conducting a plasma etching process in a process chamber;

recording in a curve changes in a parameter of RF coil tuning counts in said chamber during said etching process on a time scale; and defining an end-point of the plasma etching process for a specific material layer as a point where the direction of a slope of the curve changes.

12. A method for detecting end-point in plasma etching by changes in RF coil tuning counts according to claim 11 further comprising the step of recording in a curve changes in a parameter of RF coil tuning counts by plotting an RF coil turning count vs time curve.

13. A method for detecting end-point in plasma etching by changes in RF coil turning counts according to claim 11 further comprising the step of defining said end-point of the plasma etching process as the point where a TiN etch stop layer is reached.

14. A method for detecting end-point in plasma etching by changes in RF coil tuning counts according to claim 11 further comprising the step of defining said end-point of the plasma etching process as the point where an interface between an Al—Cu layer and a TiN layer is reached.

15. A method for detecting end-point in plasma etching by changes in RF coil tuning counts according to claim 11 further comprising the step of defining said end-point of the plasma etching process as the point where a sudden increase in the RF coil tuning count is intersected by a sudden decrease in said RF coil tuning count.

16. A method for detecting end-point in plasma etching by changes in RF coil tuning counts according to claim 11 further comprising the step of conducting said plasma etching process while continuously tuning in real-time a zero differential in phases between a RF voltage and a RF current.

* * * * *